United States Patent [19]

Call et al.

[11] Patent Number: 5,185,734
[45] Date of Patent: Feb. 9, 1993

[54] CALIBRATING AND POWER-PROTECTING LASER DRIVE CIRCUITS

[75] Inventors: David E. Call; Julian Lewkowicz, both of Tucson, Ariz.

[73] Assignee: International Business Machines Corporation, Armonk, N.Y.

[21] Appl. No.: 555,952

[22] Filed: Jul. 20, 1990

[51] Int. Cl.⁵ .............................................. G11B 7/125
[52] U.S. Cl. ................................... 369/116; 369/44.27
[58] Field of Search ...................... 369/116, 44.27, 53, 369/54, 58

[56] References Cited

U.S. PATENT DOCUMENTS

| | | | |
|---|---|---|---|
| 4,503,467 | 3/1985 | Icla et al. | 358/212 |
| 4,516,235 | 5/1985 | Tarzaiski | 369/116 |
| 4,541,055 | 10/1985 | Wolfe et al. | 364/474 |
| 4,545,018 | 10/1985 | Clements et al. | 364/474 |
| 4,631,713 | 12/1986 | Romeas et al. | 369/54 |
| 4,685,097 | 8/1987 | van der Put | 369/116 |
| 4,692,606 | 9/1987 | Sakai et al. | 369/116 |
| 4,709,369 | 11/1987 | Howard | 372/38 |
| 4,747,091 | 5/1988 | Doi | 369/116 |
| 4,785,443 | 11/1988 | Minami et al. | 369/116 |
| 4,843,604 | 6/1989 | Fujiwara et al. | 369/116 |
| 4,937,799 | 6/1990 | Hashimoto et al. | 369/116 |

FOREIGN PATENT DOCUMENTS

| | | |
|---|---|---|
| 0223576 | 5/1987 | European Pat. Off. |
| 0352125 | 1/1990 | European Pat. Off. |

Primary Examiner—Andrew L. Sniezek
Assistant Examiner—P. W. Huber
Attorney, Agent, or Firm—H. F. Somermeyer

[57] ABSTRACT

An optical disk recorder has a laser driven by a digital analog converter (DAC). During initialization a pair of comparators actuated at minimum and at maximum power levels for actuating a microprocessor to calibrate a DAC 23 between the minimum and maximum power levels rended of digital input changed to the DAC. The same comparators can be used during normal recording and reading operations for detecting under and over power conditions of the laser. Procedures for the calibration and over power and under power detection are described.

7 Claims, 4 Drawing Sheets

– 1 –

CALIBRATING AND POWER-PROTECTING LASER DRIVE CIRCUITS

FIELD OF THE INVENTION

The present invention relates to laser controls and more particularly to controlling solid state lasers used in optical disk recorders.

BACKGROUND OF THE INVENTION

Lasers, particularly solid state lasers, have been used for years for recording and reading or sensing data on optical media. It has also been found that the control circuitry, as well as the laser itself, are subjected to unintended changes in their operating parameters. Further, the operating parameters of media also vary from one medium to the next; such variation are significant when using so-called removable optical media.

It is, of course, common practice to calibrate the laser circuits to operate with a given optical medium; such calibration usually involves analyzing the laser light intensity at the optical medium, then setting operation of the laser control circuits to match a predetermined or desired light intensity at the optical medium. Such controls have been used to enable setting digital to analog converters (DAC) for enabling recording, writing, and erasing operations of optical medium. It is desired to provide a better control for such lasers in that the laser will be first calibrated for its own circuits for determining the power level changes of the digital analog converter steps such that a microprocessor can send a number to the digital analog converter to obtain a desired power.

Laser operations have been controlled independently of the optical medium. For example, in the Howard U.S. Pat. No. 4,709,369 those establishing a DC voltage which represent the peak value of light pulses out of a laser diode independent of the modulation pattern of the light pulses. Howard shows an integrative feedback loop which compares the desired power of the laser with the actual output from the conditioning means to establish an output current to cause the laser diode to supply light pulses of the desired value. Such conditioning includes a sample and hold circuit operative in association with an integrator feedback loop to perform at a rate as if the modulated or chopped light from the laser diode were continuously on. The adjustment of the laser is made by human operator. It is desired to eliminate the need for a human operator by automatically calibrating and adjusting the laser output.

The Ida, et al. U.S. Pat. No. 4,503,467 shows a digital to analog converter driven by an increasing counter for increasing the digital to analog converter output in a step-wise manner from a lower-limit value to an upper-limit value. Comparators compare the output signals of the light receiving units which are in a row of light receiving units with an analog reference signal which represents darkness or no light. Memories receive the digital signal and are controlled by the comparators to store instantaneous digital values when the corresponding comparators change their states i.e., capture the numerical value used to generate a predetermined analog value. It is desired to provide for a faster calibration technique not involving the use of digitized numerical values until after the calibration has been completed.

SUMMARY OF THE INVENTION

A digital to analog converter controls the output light intensity of a laser diode, such as for recording signals on an optical disk. Sensing means senses the laser beam or its calibration window output. The laser power for recording is calibrated by initially setting the digital to analog converter (DAC) to supply a drive to a laser at a predetermined minimal laser power. The numerical input to the DAC is increased until an analog comparison of the laser beam intensity reaches a predetermined value above the minimal laser power level. At that point, the calibration steps of the DAC and laser circuits stops. A calculation in a microprocessor subtracts the minimal power value from the power reference value, then divides the number of DAC setting between the two power levels to obtain a DAC efficiency which is laser output power level change per DAC unit-value input change. Then the power levels desired for operating the laser are determined. The relationship of each DAC unit-value input for obtaining absolute laser output value is then determined by calculations.

In another aspect of the invention the comparators used for determining the minimal power level and a maximum or reference power level are then used during normal day to day operations of the laser for detecting under power and over power conditions.

The foregoing and other objects, features and advantages of the invention will be apparent from the following more particular description of preferred embodiments of the invention, as illustrated in the accompanying drawings.

DETAILED DESCRIPTION

Figure 1:
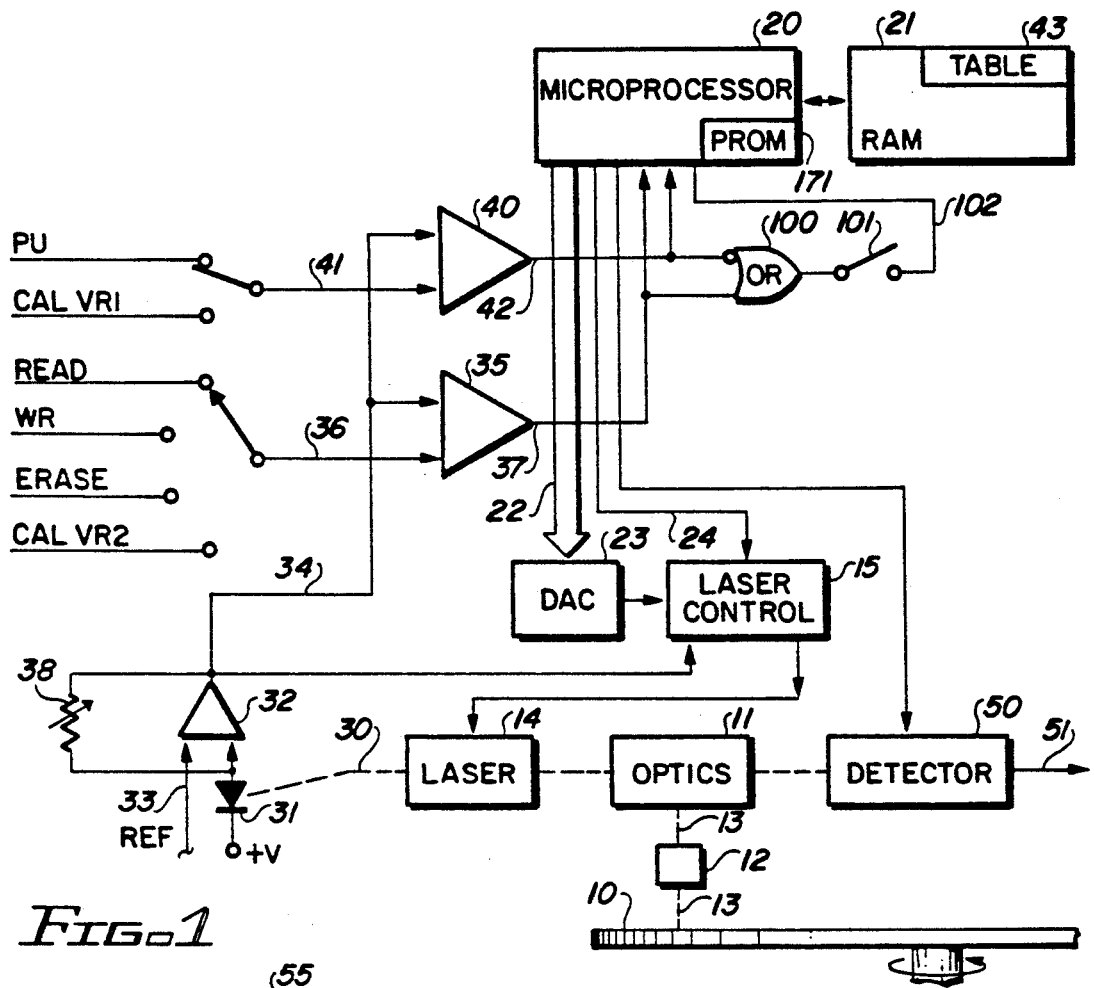
FIG. 1 is a simplified block-diagrammatic showing of an optical disk recorder employing the present invention.

Referring now more particularly to the appended drawings, like numerals indicate like parts and structural features in the various Figs. A magnetooptical disk 10 is suitably mounted for rotation in an optical disk recorder (mechanical details not shown). Other types of optical media may also be employed while practicing the present invention. An optical system 11 which includes the usual beam splitters, and the like, supplies a light beam through objective lens 12 over light path 13 and receives reflected light from disk 10 over the same path and objective lens 12. Laser 14 supplies a light beam through optics 11 to disk 10 as controlled by laser control 15, as later detailed in FIG. 3. The FIG. 1 illustrated recorder-player is under control of a programmed microprocessor 20 which has a random access memory (RAM) 21. Microprocessor 20 supplies a digital value over cable 22 to digital to analog converter (DAC) 23. DAC 23 supplies an analog signal to laser control 15 for determining the recording beam intensity emitted by laser 14 to optics 11. Such laser output light intensity includes modulation based upon data as supplied by microprocessor 20, or other data handling circuits. Line 24, extending from microprocessor 20 to laser control 15, signifies additional mode control for controlling the laser control circuits 15, all as will become apparent.

Laser 14 is controlled in intensity by a feedback circuit in laser control 15. Laser 14 emits an auxiliary beam over light path 30 to a photo diode 31. Photo diode 31 varies the photo current amplitude in accordance with the laser 14 emitted light over path 30, as is known. Transimpedance amplifier 32 responds to the diode 31 changed current amplitude compared with a reference value on line 33 to supply signals over line 34 indicative of laser 14 output beam intensity. Potentiometer 38 adjusts the gain of transimpedance amplifier for achieving a target read output power level. This adjustment effects a calibrated signal level on line 34 in volts per watts. As a result, the signal level on line 34 represents absolute light power output of laser 14. Laser control 15, under normal operations, responds to the signal level on line 34 to maintain the laser 14 operation at predetermined intensity values, as is known.

In accordance with the invention, additional circuits are provided for processing the line 34 signal for enabling automatic calibration of DAC 23 such that numerical values on cable 22 accurately represent a desired light intensity output of laser 14. It is expected that DAC 23 will be calibrated each time a new disk 10 is inserted into the player and/or during predetermined error recovery procedures. DAC 23 is calibrated based upon increases in laser 14 intensity between a minimal or safe value and a maximum calculated predetermined operational value. Such maximum value is predetermined based upon the optical medium 10 operating range as well as laser 14 operating limits.

A first analog comparator 40 receives the line 34 signal at one input for receiving an indication of the laser 14 output light intensity. On line 41 is a reference value indicative of the desired minimal or safe value CAL VR1. Comparator 40 supplies an inactive signal over line 42 to microprocessor 20 at all times until the signal on line 34 indicates that laser 14 is emitting a light beam equal to or greater than the minimal value. At this time comparator 40 supplies an active signal over line 42 to microprocessor 20. Microprocessor 20 then stores the DAC 23 input value in table 43 for later calculating values to be used in controlling laser 14.

The microprocessor 20 programming, as later described, continuously increases the numerical value over cable 22 to thereby cause DAC 23 to actuate laser 14 to ever increasing power levels for increasing output light intensities. This repetitive step by step increasing continues until comparator 35 (line 36 is connected to the CAL VR2 reference signal via switch 36), constructed in the same way as comparator 40, detects a signal on line 34 at its first input which is greater in amplitude than the reference signal on line 36 representing a maximal or desired reference output light intensity of laser 14. Comparator 35 when sensing the line 34 signal being less than the reference signal on line 36 supplies an inactive signal over line 37 to microprocessor 20. As soon as comparator 35 determines that the line 34 signal exceeds the reference signal on line 36, then an active signal is supplied over line 37 to microprocessor 20, whereupon microprocessor 20 stores that DAC 23 input value in table 43. At this point, microprocessor 20 has completed the measurement portion of the initial DAC 23 calibration.

It is to be understood that microprocessor 20 also controls all aspects of the illustrated optical disk recorder. For example, detector 50 which detects the data sensed from medium 10 is also controlled to supply the data signals over line 51 as is well known. Detector 50 is an optical detector which is optically coupled through optics 11.

Figure 2:
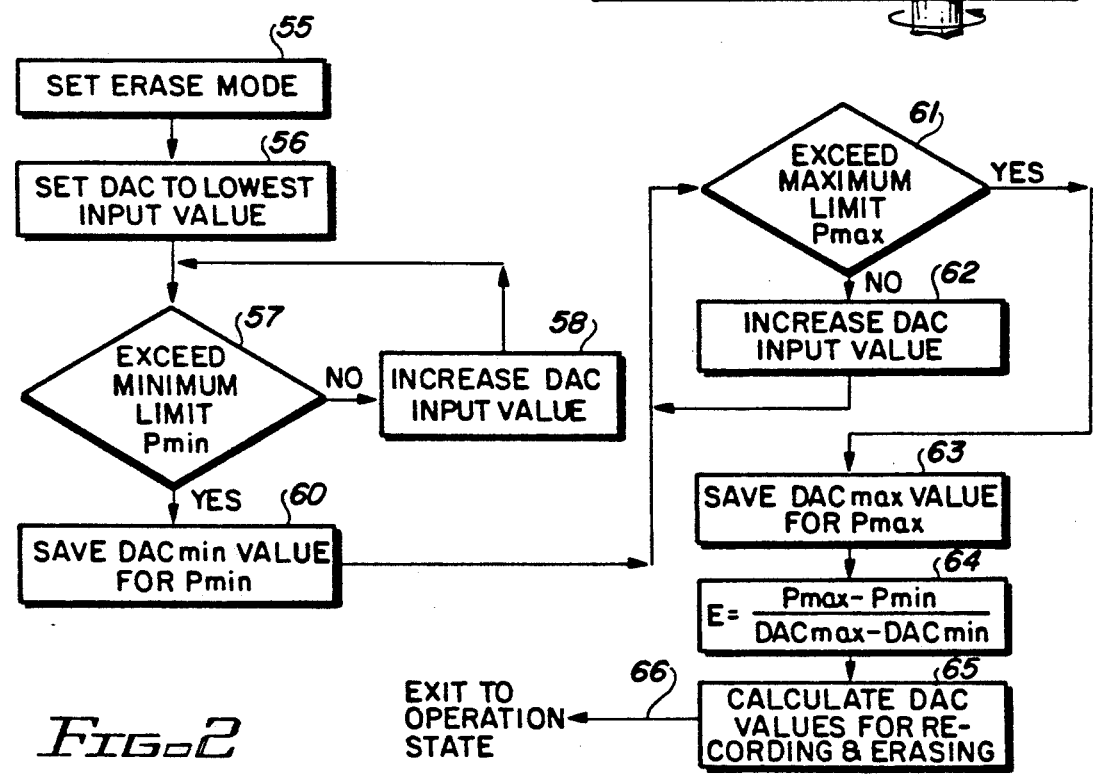
FIG. 2 is a simplified flowchart of a machine operation shown practicing the present invention in the FIG. 1 illustrated embodiment.

FIG. 2 illustrates in flow chart form the machine operations described with respect to the FIG. 1 illustrated recorder. At machine step 55 microprocessor 20 sets the erase mode for operating the laser 14. Erase mode merely means that laser 14 is continuously on at a constant laser output intensity, i.e., such as used for erasing signals recorded on magnetooptic medium 10. At machine step 56, microprocessor 20 supplies a number over line 22 for setting DAC 23 to a lowest or minimal output light power level for laser 14. At machine step 57, microprocessor 20 examines the signal state of line 42 to determine whether or not the measured light intensity from laser 14 over light path 30 is exceeding the minimal power limit Pmin indicated by the signal on line 41. Normally during a first step the limit is not exceeded where upon the DAC 23 value is increased at machine step 58. Machine step 57 is then reentered where steps 57 and 58 are repeated until comparator 40 determines that the limit for the calibration has been exceeded. At this time, microprocessor 20 in machine step 60 stores in table 43 the value sent to DAC 23 "DACmin", the DAC input value for actuating laser 14 to emit light at "Pmin" power level.

The procedure used in above-described machine steps 57 and 58 is used in machine steps 61 and 62 for determining the maximum laser power output level. At machine step 61, microprocessor 20 senses the signal state of line 37 (comparator 35 output). If the line 37 signal is in an inactive state, then the line 34 signal is less that the limit amplitude supplied over line 36, i.e. the laser 14 output light intensity is less than the desired maximum level. The DAC 23 input value is increased in machine step and the machine steps 61-62 are repeated until comparator 35 supplies an active signal to line 37. When the level "Pmax" is exceeded as detected at machine step 61, microprocessor 20 saves the DAC 23 input value in table 43 as DACmax, the DAC input value resulting in a laser 14 output light power of Pmax.

The microprocessor then performs machine step 64 which first calculates the power range represented by the actions of comparators 40 and 35 by subtracting the minimum power level Pmin represented by comparator 40 from the maximum power level Pmax represented by the action of comparator 35 (Pmax −Pmin) Microprocessor 20 then calculates the DAC 23 range determined by comparators 35 and 40 by subtracting the DAC 23 number DACmin stored from the execution of machine step 57 from the DACmax value. In step 64, this power range is divided by the DAC 23 range DACmax−DACmin to obtain a value E of power level change per each DAC 23 step or change of a unitary value in numerical control on line 22. Such value E can be considered as being total efficiency of the laser driver 15 and laser 14.

Then in machine step 65, microprocessor 20 uses the DAC value E or efficiency for calculating the various settings for DAC 23 for recording and erasing operations. In step 65 the DAC input digital value for recording is calculated by adding the DACmin value to a respective calculated recording or erasing power level increment. In the equation below, "P" signifies either the desired recording or erasing power level;

$$\frac{P - Pmin}{E} ; \quad (1)$$

Therefore, the DAC 23 setting for any desired power level P is:

$$DAC = DACmin + [(P-Pmin)/E] \quad (2)$$

The DACmin can be selected to be zero which eliminates steps 57 and 58. Step 56 sets DACmin to zero which is Pmin. In this instance, the calculations of step 65 are simplified in that DACmin=0 which reduces equation (2) to:

$$DAC = \frac{P - Pmin}{E} \quad (3)$$

and the efficiency equation to:

$$E = (Pmax - Pmin)/DACmax \quad (4)$$

The DAC efficiency E is affected by the operation of diode 31, laser 14, amplifier 32 and laser control circuits 15 as well as DAC 23 again. Changes in "E" can indicate changes in any of these components. Repeated E measurements are device maintenance and operation indication.

The calculated values for equations (2) or (3) are then stored in table 43 for use by microprocessor 20 during normal operations. During recording, the value calculated at step 65 is used to change the state of medium 10 and the area currently being scanned by the laser beam traveling over path 13 while inbetween the recording steps i.e., to record zeros or no changes, the read output laser light power level is used. Now the recorder in FIG. 1 is prepared for normal operations as indicated by step 66. At this point, comparators 35 and 40 are now used for detecting over power conditions and under power conditions of laser 14 beam emission as will be later described.

Figure 3:
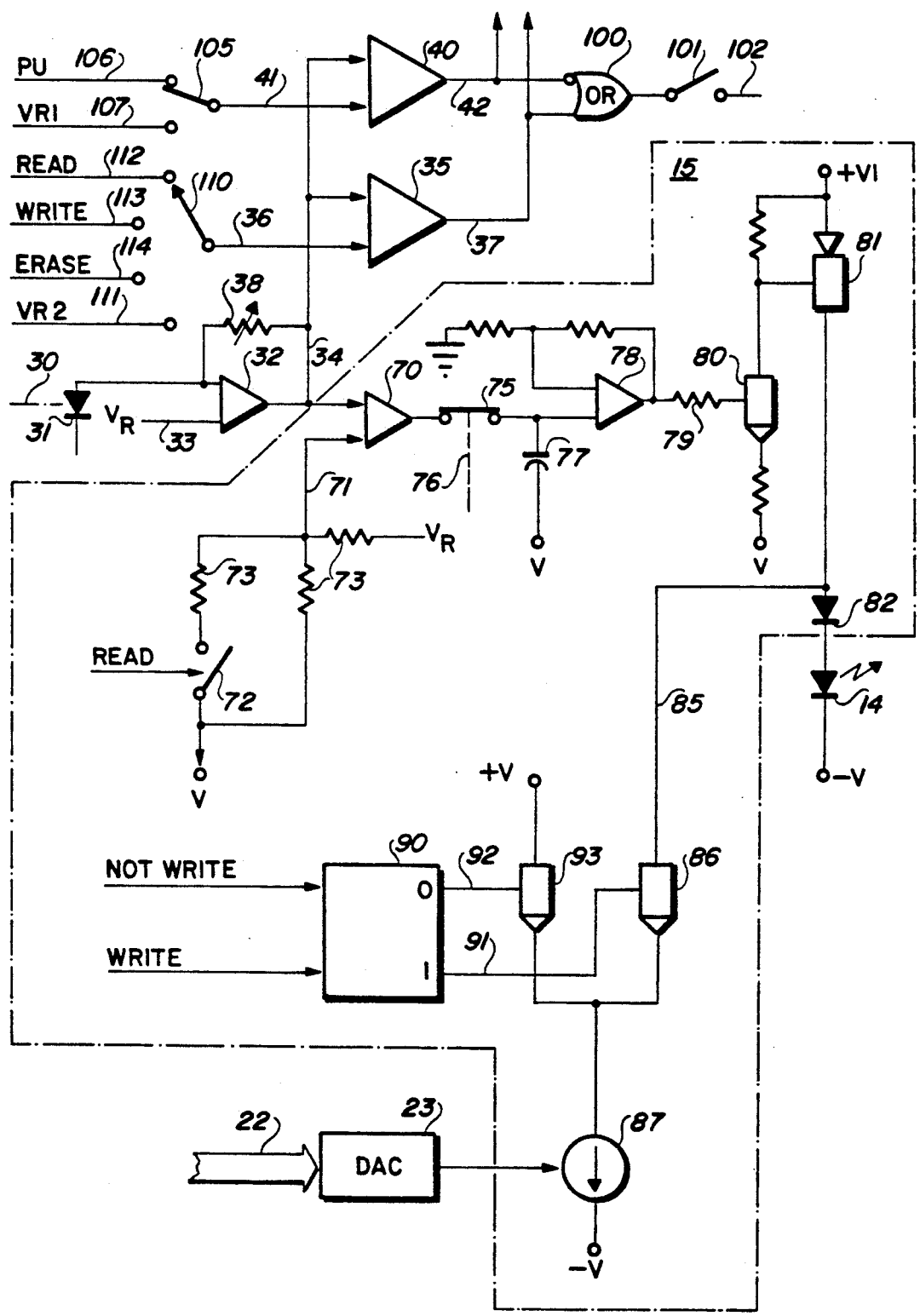
FIG. 3 is a circuit diagram showing the operation of the calibration, over power and under power operations of the FIG. 1 illustrated optical disk recorder.

Referring next to FIG. 3, the details of laser control 15 are shown. In laser control 15 amplifier 70 receives a signal from line 34. A reference input at line 71 controls amplifier 70 during read operations. Resistor network 73 is coupled to reference voltages with the bias supplied to amplifier 70 over line 71 being varied by the read switch 72. The signal voltage amplitude difference between the line 34 and line 71 signals is the voltage error output between a desired read laser power level and the acted laser output power level. Amplifier 70 amplifies this error voltage and supplies it through control switch 75 as closed via the signal from microprocessor 20 received over line 76. Switch 75 is closed for read operations. Capacitor 77 smooths the signal received from amplifier 70 and acts as a sample and hold capacitor when switch 75 is open. A second amplifier 78 buffers and amplifies the error signal for passing it through resistor 79 to a controlling transistor 80, which acts as a current control. A second transistor 81 has its base connected to the collector of transistor 80 for supplying a current from a reference source +V1 which flows through voltage shifting diode 82 thence to laser diode 14 for causing emission of light. The current value flowing through transistor 81 is the total value for the mode involved; for recording this means a recording level of current flowing through laser diode 14 for actuating it to emit an output light having a power level for recording on a record medium. Between the writing impulses i.e., the record zeros or no change in the record medium that was erased, the current from transistor 81 is partially diverted through a transistor 86 to current sink 87. The value of current through current sink is controlled by DAC 23, therefore controlling the laser 14 emission. A write data signal is supplied to switch 90, shown as a flip-flop. A transistor turn-off signal supplied over line 91 makes transistor 86 non-conductive. This action forces the current from transistor 81 to flow through the laser diode 14 for "causing maximum emission of radiation or maximum light output." Simultaneously, the line 92 from the flip-flop 90 switches transistor 93 to current conduction for replacing the current in current sink 87 previously supplied by transistor 86. The result is recording binary ones on the record medium 10, such as by reversing the remanent magnetization of the area scanned by the beam on path 13. When a not write signal is being supplied to flip-flop 90, the current conduction of transistors 86 and 93 is reversed for diverting current from transistor 81 to reduce the emission of radiation or light from laser 14.

During reading operations, switch 75 being closed, a laser 14 control loop exists such that the line 34 signal (representing emitted laser light power) matches the line 71 signal (desired read laser output power level). Each time microprocessor 20 changes the DAC 23 input value, it closes switch 75 and sets flip-flop 90. Then transistor 86 becomes current conductive. This action changes the current amplitude in current sink 87 such that the amount of current being diverted from transistor 81 is also changed. Upon each change of input value to DAC 23, a time delay is required to allow the laser control servo loop described above to reach an equilibrium operating point. During this time delay, the change in current source flowing through transistor 81. During recording or erasing modes, switch 75 is kept open to prevent the above described servo action from changing the laser drive current during recording or erasing.

Comparators 35 and 40, by changing comparator reference values, not only are used for calibrating the DAC 23 but also for detecting under and over power conditions. Switch 105 has its output terminal connected to line 41 for controlling comparator 40. During the calibration phase, microprocessor 20 as indicated by signal on line 24 (not shown in FIG. 3) switches electronic switch 105 to line 107 such that reference voltage VR1 supplied over line 41 to comparator 40 for detecting the minimal power laser 14 output level. During normal operations, switch 105 is switched to line 106 which indicates a minimum power to be emitted by laser 14. Similarly, switch 110 has its output connected to line 36 as an input to switching comparator 35. During calibration, line 111 is connected through switch 110 to line 36 for determining the maximum power calibration level indicated by VR2. During the read mode of operation, switch 110 couples line 112 which supplies a safe or maximal read amplitude indicating signal to line 36 for ensuring that the read laser intensity is low enough to prevent any unintended erasure of recorded information in the area being scanned by the laser 14 light beam. In the write mode, the maximum power indication for the write mode on line 113 is supplied at line 36. This prevents over power of the laser 14. In a similar manner, but not required, is the erase level safe value signal on line 114 to be used during the erase mode.

If either of the switching comparators 35 and 40 supplies the respective signal during normal operations over lines 42 and 37, those signals are passed through logic OR circuit 100 through switch 101, which is closed only during normal operations, thence over line 102 to microprocessor 20. During normal operations, signal on line 102 interrupts microprocessor 20 to turn off the laser 14.

The two-level under power and over power protection handles the following conditions. If a sudden change occurs in any of the components, such as shown in FIG. 3, or a sudden obstruction of the optical path occurs due to debris, or other causes, is detected by the under and over power detectors 35 and 40 during normal operating mode. Reduced transparency in the optical path 30 reduces the photo current from photo diode 31, as a result, laser controller 15 tries to increase the laser 14 current and thus its power intensity output when in fact such increase is not warranted. In this case, comparator 40 detects the under-power condition which results in microprocessor 20 turning off the laser power. If there is a sudden change such as one that occurs within 3 microseconds, a significant voltage excursion occurs at the output of amplifier 32 and is detected as either an under power condition by comparator 40 or an over power condition by comparator 35. Failure of circuit components within laser control 15 can also cause various changes in laser 14 operation all of which will be detected by the comparators 35 and 40 causing microprocessor 20 to turn off the laser for protecting recorded data. Slower changes in optical path efficiency, detector 31 efficiency laser 14 efficiency, circuit 15 and others are detected by recalibration of DAC 23 efficiency as will be described.

Figure 4:
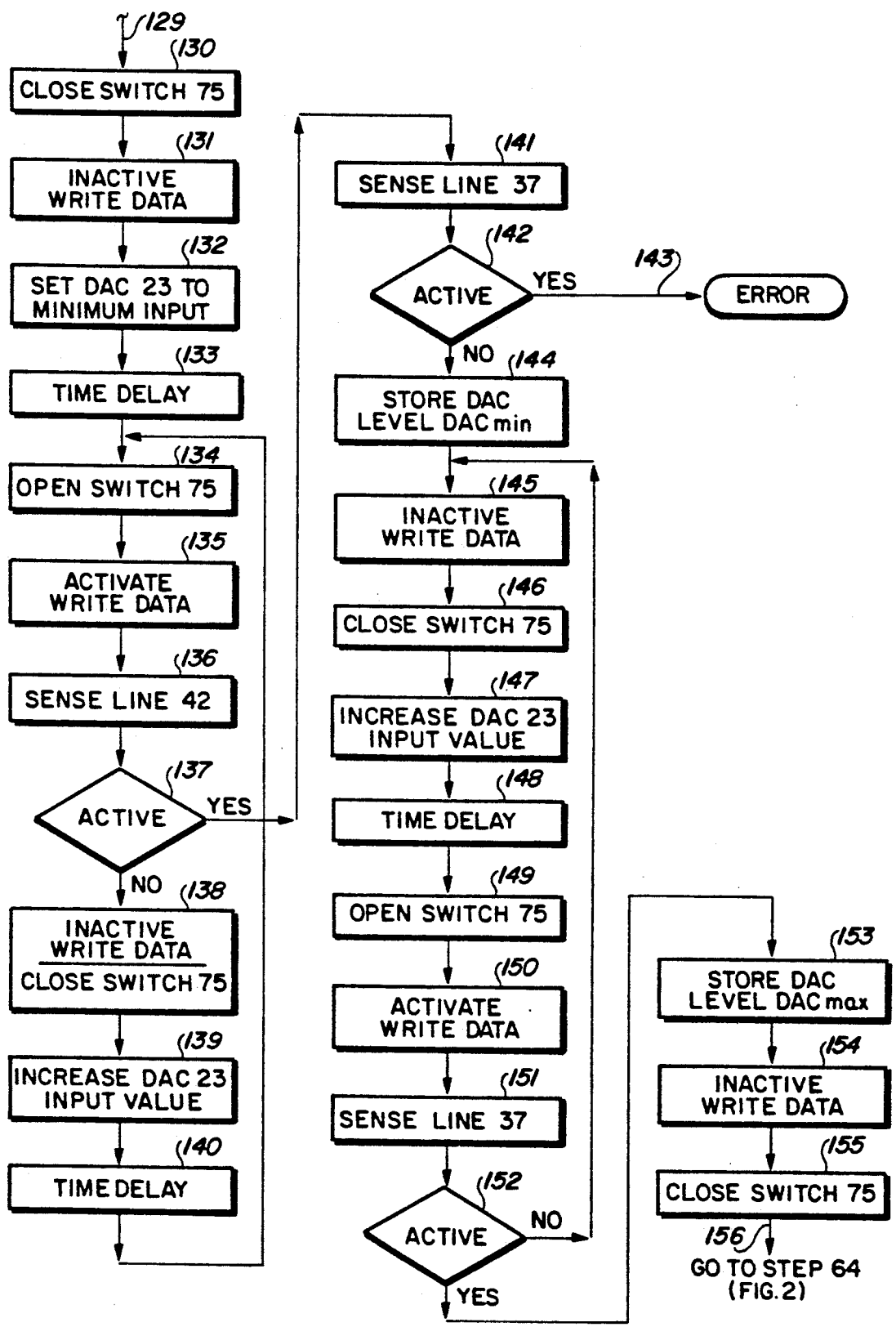
FIG. 4 is a simplified chart of machine operations showing the initial calibration of the DAC efficiency.

The machine operations chart of FIG. 4 shows a sequence that microprocessor 20 executes for calibrating DAC 23 beginning at a initialization time at line 129. At machine step 130, microprocessor 20 closes switch 75 for enabling the laser servo to change its operating power level as DAC 23 receives changes input values from the microprocessor. At step 131, write data input is kept inactive such that flip-flop 90 (FIG. 3) is kept in an inactive state. This flip-flop 90 state actuates transistor 86 to be current conductive and transistor 93 to be current non-conductive. At machine step 132, microprocessor 20 supplies the minimal or minimum digital value signals over cable 22 to DAC 23 (sets DAC 23 to minimum input value). At this time, the current in current sink 87 is subtracted from the transistor 81 collector current. At machine step 133, a time delay allows the FIG. 3 illustrated circuit 15 and the optical response to reach steady-state conditions reflecting the DAC 23 minimum input value. As a result, the transistor 81 collector current is changed such that the laser 14 output light power, represented by the signal on line 34, matches the desired level represented by the line 71 signal. At machine step 134, microprocessor 20 opens switch 75 for holding the transistor 81 collector current at a constant value determined by the current DAC 23 digital input value. Microprocessor 20 in machine step 135 activates the write data signal by setting flip-flop 90 to the active state. The flip-flop 90 active state forces transistor 86 to be current nonconductive and transistor 93 to be current conductive. At this instant, all the current from the collector of transistor 81 is supplied to laser diode 14 causing it to emit light at a maximum power level determined by DAC 23 setting. Microprocessor 20 then at machine step 136 senses the comparator 40 output signal on line 42; if the comparator 40 signal is inactive (relatively negative, for example), as sensed by branch step 137, microprocessor 20 inactivates the write data (resets flip-flop 90) and in step 138 closes switch 75. At machine step 139 the microprocessor 20 supplied input value on cable 22 is increased by a predetermined amount. This DAC 23 changed input is followed by a time delay 140 before the steps 134–137 are repeated until the comparator 40 supplies an active signal (relatively positive signal, for example) over line 42 which cause microprocessor 20 to exit the loop as a minimum output light power has been generated by laser 14.

At step 141, the line 37 is sensed to determine if it is still inactive. If the line 37 signal is active at branch step 142, then an error condition has occurred i.e., the maximum and minimum level should not be the same. If the line 37 signal is inactive at step 142, then microprocessor 20 at step 144 stores the minimum level value (DACmin) in table 43 of RAM 21. Then microprocessor 20 enters a machine operations loop having steps 145–152 for finding the maximum power level as detected by switching comparator 35. Machine steps 145, 146 respectively inactivate write data (reset flip-flop 90) and close switch 75. In step 147, DAC 23 input value is increased by a predetermined number of units, such as 1, 2, or 3. Microprocessor 20 tallies the increases of DAC 23 steps and stores the tally in table 43. After the DAC input value has been increased, a time delay 148 occurs for allowing the laser system to settle to a steady-state condition. Machine steps 149, 150 respectively open switch 75 and activate write data (set flip-flop 90). At step 151 microprocessor 20 senses line 37 for the active or inactive signal condition. If the line 37 signal is inactive at step 152, the loop is reentered and repeated until line 37 become active. When the line 37 signal is active, microprocessor 20 in machine step 153 stores the current DAC 23 input value in table 43 as DACmax, in machine step 154 resets flip-flop 90 to inactivate write data and closes switch 75 at machine step 155. Then from step 155, microprocessor 20 proceeds to step 64 of FIG. 2 via line 156.

Figure 5:
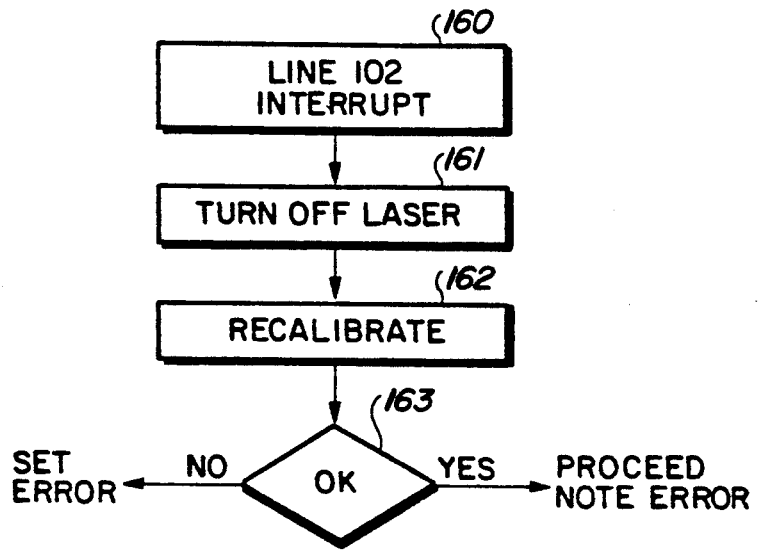
FIG. 5 is a chart of machine operations showing a microprocessor response to an over or under power error detection in the FIG. 1 illustrated embodiment.

FIG. 5 is an abbreviated flow chart of normal machine operations showing the detection of under and over power conditions. Microprocessor 20 has a known interrupt input. The line 102 signal is supplied to ones of those microprocessor 20 real time interrupts having a high priority. As soon as a signal on line 102 activates the interrupt, such as at step 160, microprocessor 20 immediately turns its attention to that interrupt. At step 161, microprocessor 20 turns off laser 14 in response to the received interrupt. Then at step 162, the laser 14 can be recalibrated to see if a momentary or intermittent condition occurred. If the recalibration is successful, then at step 163 a normal operation proceeds with an error being noted in an error log in a usual manner. If the recalibration is not successful, then a permanent error is set and laser 14 is turned off pending manual remedial actions.

Figure 6:
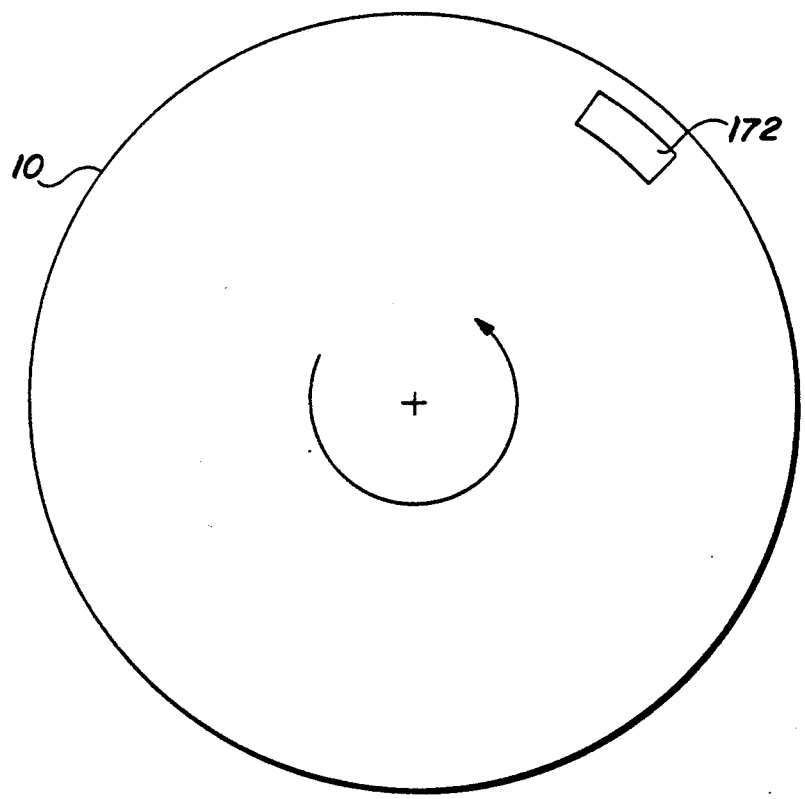
FIG. 6 is a diagrammatic showing of an optical disk on which power level and control level information is recorded which is usable with the FIG. 1 illustrated embodiment.

FIG. 6 is a simplified diagrammatic plan view of a disk 10 having an area 172 which stores nominal (recommended laser intensity) values for use in recording, erasing, and reading from the disk 10. Such numbers can be provided at time of manufacture for disk 10 and used by microprocessor 20 to calculate the DAC 23 digital input values for given laser output power levels for operating with a particular individual disk. Whenever a disk 10 having the calibration information in area 171 is loaded into a disk player, then during initialization such information is read by microprocessor 20 for use in initializing the recorder to the particular disk 10. In another aspect of the present invention, at time of manufacturing, the FIG. 1 illustrated recorder, the DAC 23 can be calibrated in the factory. Such DAC efficiency calibration and calculation results can be stored in a long term retentive storage in PROM of 171 for later use in the recorder. In subsequent DAC efficiency calibrations, the newly obtained DAC efficiency value "E" is compared to the initial E value stored in PROM 171. Such comparison is useful in measuring changes in DAC 23 efficiency value E over time or with known operating conditions. When the limits are exceeded, then an error condition is signaled for manual intervention and remedial action. DAC calibration using the present invention detects such variations in operation of any optical recorder or other optical device.

While the invention has been particularly shown and described with reference to preferred embodiments thereof, it will be understood by those skilled in the art that various changes in form and details may be made therein without departing from the spirit and scope of the invention:

What is claimed is:

1. In a machine-executed method of operating an optical device for calibrating a digitally settable digital to analog convertor (DAC) for controlling a laser to emit a laser beam at calibrated digitally set power levels, said DAC having a digital input and an analog output connected to the laser for controlling the laser to emit an output laser beam having an intensity indicated by the analog output signal magnitude of the DAC, the machine-executed steps of:

digitally setting an initial input value into the DAC digital input to drive the laser to emit a laser beam having a predetermined minimal laser power value;

sensing the laser beam to measure its emitted power level value;

establishing a digital predetermined reference power value;

comparing said measured emitted power value with said predetermined reference power value, if the sensed laser beam power value is less than said predetermined reference power value, adding a predetermined digital incremental value to the DAC digital input for digitally increasing the DAC input digital setting, by said predetermined digital incremental DAC input setting to cause the laser to emit a laser beam at a higher power value;

repeating the comparison and setting steps until the measured emitted power value is not less than said predetermined reference power value;

tallying said digitally increases to said DAC input to maintain a total number of all said digital increases from said initial input setting including storing said total number into a digital table;

in a DAC calibration calculation step, subtracting the digital minimum power value from said digital power reference value to obtain a difference power value;

dividing said difference power value by the total number of DAC settings stored in said table to obtain a laser beam output intensity change value for each said increment in the DAC digital input as calibrated DAC value;

digitally indicating a power level value desired for operating the laser;

in a desired DAC setting calculation step, subtracting said predetermined minimum power level value from said desired power level value to obtain a DAC change power level value; dividing said DAC change power level value by said calibrated DAC value to obtain a DAC input digital value; then adding said DAC input digital value to said initial input value to obtain a desired input digital value; and setting said desired input digital value into said DAC digital input for operating said laser at said desired power level value.

2. In the machine-executed method set forth in claim 1, further including the steps of:

selecting the optical device to be an optical disk recorder selecting said desired digitally indicated power level value to be a recording power level and driving said laser at said desired digitally indicated power level value;

and selecting a second desired digitally indicated power level value to be an erasure power level value; and then performing the desired DAC setting calculation step, then setting said DAC digital input with said desired input digital value resulting from said second desired digitally indicated power level value.

3. In the machine-effected method set forth in claim 2, further including the steps of:

selecting an optical record medium to be recorded upon or read from, said optical record medium having recorded thereon digitally indicated nominal read and record laser beam power level values;

reading said nominal laser beam power level values as desired digitally indicated power level values;

repeating said desired DAC setting calculation step for each of said read nominal values including solving the equation DAC setting = DACmin + wherein DACmin is the DAC setting for said minimal laser power, P is said nominal laser beam power level values, Pmin is the predetermined minimal laser power level and E is the calibrated DAC value including storing the DAC setting for each said nominal values respectively as the desired read and record digitally indicated power level values in said table.

4. In the machine-effected method set forth in claim 3, further including the steps of:

after storing said desired read and record digitally indicated power level values, operating the optical disk recorder for recording and reading data on and from, respectively, said optical medium including setting said stored desired read digitally indicated power level value into said DAC before reading from said optical record medium and setting said stored desired record digitally indicated power level value into said DAC digital input before recording onto said optical record medium; and during said recording and reading onto and from the optical record medium, substantially continuously sensing said laser beam power level value;

establishing and indicating maximum and minimum acceptable power level values for said recording and reading;

comparing the sensed power level value with said indicated maximum and minimum power level values respectively for said recording and reading for detecting over and under power levels of said laser; upon detecting either an over or under power level during said recording or reading, respectively, turning off the laser and instituting predetermined error recovery procedures.

5. In a optical apparatus having a laser for emitting a beam of radiation for effecting predetermined optical operations and optic means optically connected to the laser for receiving the beam of radiation for carrying out the predetermined optical operations;

including, in combination:

a digital to analog converter (DAC) having a digital input and an analog output, said digital input having a plurality of settings including a minimal change value between any two successive settings, the analog output being connected to the laser for controlling the laser to emit a beam of radiation having an intensity determined by the digital input to the DAC;

retentive storage means storing digital data indicating a digital input value of the DAC for a plurality of analog output values of the DAC for obtaining predetermined intensities in the beam of radiation including an indication E of DAC efficiency, said E indicating a change in laser beam intensity for said minimal change value in input digital value as said digital input;

means for indicating a desired intensity of the beam of radiation; and control means connected to the DAC digital input, the retentive storage means and to the indicating means for supplying digital signals having a calculated value to the DAC digital input for actuating the laser to emit a beam of radiation of said desired intensity, including calculation means for multiplying said E times said desired intensity to generate said supplied digital signals to have said calculated value representing a DAC setting for the laser to emit a beam of radiation having said desired intensity.

6. In the apparatus set forth in claim 5 further including, in combination:

measuring means in the control means and connected to the laser and to the DAC for measuring and indicating the DAC efficiency E.

7. In the apparatus set forth in claim 5 further including, in combination:

an optical storage medium in the apparatus and in a optical transducing relationship to the optic means such that information bearing signals may be recorded upon the storage medium;

said optical storage medium having a machine-sensible indication of a required recording power level for recording the information bearing signals on such medium; and said control means actuating the optic means to sense the machine-sensible indicia and comparing the sensed indicia with said retentively stored digital data for generating a digital signal derived from the stored DAC value E and said sensed indicia and supplying such digital signal to the DAC digital input for recording the information bearing signals on said optical storage medium.

* * * * *